(12) United States Patent
Watters et al.

(10) Patent No.: US 9,634,613 B1
(45) Date of Patent: Apr. 25, 2017

(54) BIAS CIRCUIT HAVING REDUCED POWER CONSUMPTION

(71) Applicant: Raytheon Company, Waltham, MA (US)

(72) Inventors: Edward A. Watters, Carlisle, MA (US); Christopher M. Laighton, Boxborough, MA (US); John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/073,853

(22) Filed: Mar. 18, 2016

(51) Int. Cl.
*H03F 3/04* (2006.01)
*H03F 1/02* (2006.01)
*H03F 3/193* (2006.01)
*H03F 1/30* (2006.01)

(52) U.S. Cl.
CPC ........... *H03F 1/0233* (2013.01); *H03F 3/193* (2013.01); *H03F 1/301* (2013.01); *H03F 2200/18* (2013.01); *H03F 2200/219* (2013.01); *H03F 2200/451* (2013.01)

(58) Field of Classification Search
CPC .......... H03F 1/0233; H03F 3/193; H03F 3/04; H03F 3/345; H03F 3/343; H03F 2200/18; H03F 1/301; H03F 1/302
USPC ........................................ 330/285, 288, 296
See application file for complete search history.

(56) References Cited

U.S. PATENT DOCUMENTS

| | | | | |
|---|---|---|---|---|
| 6,331,799 B1* | 12/2001 | Miyazawa | .............. | G05F 3/205 327/538 |
| 6,559,722 B1* | 5/2003 | Lopez | .................. | H03F 1/0272 330/296 |
| 8,106,712 B2* | 1/2012 | Lee | ....................... | H03F 1/0261 330/296 |
| 8,854,140 B2 | 10/2014 | Bettencourt et al. | | |

* cited by examiner

*Primary Examiner* — Khanh V Nguyen
(74) *Attorney, Agent, or Firm* — Daly, Crowley, Mofford & Durkee, LLP

(57) ABSTRACT

A depletion mode FET having a source electrode connected to ground; and a bias circuit for producing a bias current for a gate electrode of the FET. The bias circuit includes a pair of source follower transistors circuits; a first one of the pair of two source follower transistor circuits being coupled between a first voltage supply having a first polarity relative to the ground potential and a second voltage supply having a second polarity relative to ground potential, the first polarity being opposite to the second polarity, the first one of the pair of the source follower transistor circuits supplying a control signal to a second one of the pair of source follower transistor circuits. The second one of the pair of source follower transistors circuits is coupled between the second voltage supply and the ground potential and wherein the second one of the pair of source follower transistor circuits produces a bias signal for the control electrode of the output transistor.

4 Claims, 2 Drawing Sheets

BIAS CIRCUIT HAVING REDUCED POWER
CONSUMPTION

TECHNICAL FIELD

This disclosure relates generally to a bias circuits and more particularly to a low power consumption bias circuits for Radio Frequency (RF) Field Effect Transistor (FET) amplifiers.

BACKGROUND

As is known in the art, a Radio Frequency (RF) Transistor Amplifiers have a wide range of applications, in many of these applications it is highly desirable to reduce the power required to operate these amplifiers. As is also known, one type of RF amplifier includes a Group III-V semiconductor, depletion mode, Field Effect Transistor (FET), indicted as "R F FET" in FIG. 1, arranged in a common source configuration requiring operation with both a positive voltage supply ($+V_{DD}$) and a ground potential, as shown in FIG. 1. More particularly, the drain of the RF FET is coupled to $+V_{DD}$, the source is coupled to ground, and the gate has a rectifying (diode) Schottky contact with the III-V semiconductor. The gate is fed by an RF input signal. The input RF signal at the gate is amplified by the RF FET and the amplified RF signal appears at the drain of the RF FET.

As is also known in the art, the RF FET gate of the RF amplifier requires a quiescent DC bias voltage in addition to quiescent DC gate current. This DC bias voltage comes from a DC voltage source with the amount of current supplied to the gate (a gate current) typically being a function of the RF signal fed to the gate of the RF FET. One such DC voltage source is shown in FIG. 1. Here, the DC voltage source is a current mirror bias network having a source follower (SF) transistor circuit connected between the positive supply $+V_{DD}$ and a negative supply $-V_{SS}$. More particularly, in response to the RF input signal at the gate of the RF FET, the gate of the common source configured RF FET must be supplied the current, commonly known as gate current, from the source follower section of the current mirror bias network. This gate current supplied to the RF FET must be sufficient to supply proper amounts current for the rectifying Schottky contact gate of the RF FET.

SUMMARY

In accordance with the present disclosure, a bias circuit is provided for an output transistor. The output transistor has a control electrode for controlling a flow of carriers between a first electrode and a second electrode, the second electrode is connected to ground potential. The bias circuit includes a pair of source follower transistors circuits. A first one of the pair of two source follower transistor circuits is coupled between a first voltage supply having a first polarity relative to the ground potential and a second voltage supply having a second polarity relative to ground potential; the first polarity being opposite to the second polarity, the first one of the pair of the source follower transistor circuits supplying a control signal to a second one of the pair of source follower transistor circuits. The second one of the pair of source follower transistors circuits is coupled between the second voltage supply and the ground potential and wherein the second one of the pair of source follower transistor circuits produces a bias signal for the control electrode of the output transistor.

In one embodiment, the bias circuit includes: a current source for producing a reference current from the first voltage supply to ground potential; a current mirror transistor coupled to the current source, the current mirror transistor having a control electrode coupled to the control electrode of the output transistor and a source electrode connected to the ground potential; and the second one of the pair of source follower transistor circuits provides a feedback control voltage at a control electrode of the current mirror transistor.

In one embodiment, the output transistor is a Field Effect Transistor (FET) and the control electrode of the output transistor is a Schottky contact gate; the first voltage supply has a positive polarity relative to ground potential; and the second voltage supply has a negative polarity relative to ground potential.

In one embodiment, the output transistor is a depletion mode FET

With such an arrangement, the current supplied to the rectifying Schottky contact gate of the output FET is from the second one of the pair of source follower transistor circuits connected between ground and the negative voltage supply and reduces power consumption.

The details of one or more embodiments of the disclosure are set forth in the accompanying drawings and the description below. Other features, objects, and advantages of the disclosure will be apparent from the description and drawings, and from the claims.

DETAILED DESCRIPTION

Figure 2:
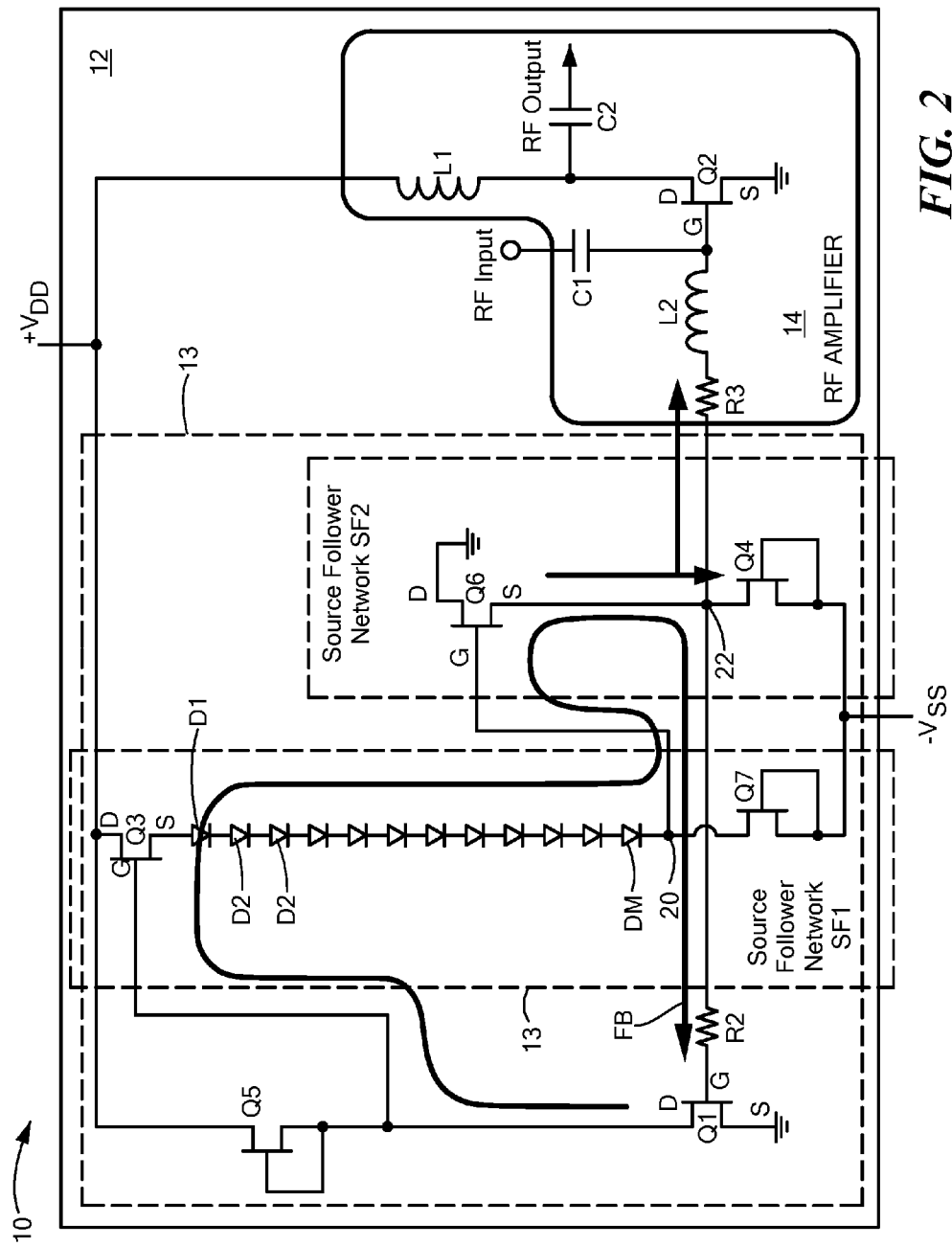
FIG. 2 is a schematic diagram of a bias circuit according to the disclosure.
Like reference symbols in the various drawings indicate like elements.

Referring now to FIG. 2, an RF amplifier circuit 10 is shown. The RF amplifier circuit 10 is formed on a common semiconductor 12, here, for example, a III-V semiconductor such as, for example GaN. The RF amplifier 10 includes a output field effect transistor FET Q2, is here an n-channel depletion-mode FET, having a grounded source electrode (S) with a drain electrode (D) connected to a $+V_{DD}$ supply, here for example +25 to +30 volts, through an RF choke, L1. The gate electrode (G) of the FET Q2 is used to control a flow of carriers between a drain electrode (D) and a source electrode (S) of FET Q2; the gate electrode (G) here being fed an RF signal through a capacitor C1 to produce an RF output signal at the drain electrode (D) that is coupled to an output through a capacitor C2, as shown. It is noted that since the FET Q2 is here a depletion-mode FET, its gate electrode (G) is typically DC biased at a potential more negative than ground potential, here the gate electrode (G) of FET Q2 is fed from a bias circuit 13, to be described below.

More particularly, the bias circuit 13 provides a constant DC voltage to the gate of FET Q2. The bias circuit 13 includes: a pair of source follower transistors networks, SF 1 and SF 2. The source follower transistor network, SF 1, is coupled between $+V_{DD}$ and $-V_{SS}$, where here, for example $-V_{SS}$ is -8 volts. The source follower network SF 2 is coupled between ground and $-V_{SS}$. The source follower network SF 2 produces the bias signal for the control electrode, gate, of the output transistor Q2. The bias circuit 13 also includes a current source, here a current source configured FET Q5, for producing a reference current from +$V_{DD}$ to ground; a current mirror transistor FET Q1 coupled to the current source, FET 5, the current mirror transistor Q1 having: a control electrode, gate electrode (G) coupled to the control electrode, gate electrode (G') of the output transistor FET Q2; and, a source electrode (S) connected to ground, as shown. Thus, the current from the drain electrode (D) to the source electrode (S) of the output FET Q2 mirrors the current passing from the drain electrode (D) to the source electrode (S) of FET Q1. It is noted that the source follower transistor network SF 2 provides a feedback control voltage (FB) at a control electrode, gate electrode (G) of the current mirror transistor FET Q1.

More particularly, the transistor FET Q1 having a grounded source electrode (S) and a drain electrode (D) connected to the +$V_{DD}$ supply through the current source configured FET Q5; the drain electrode (D) of Q1 also being connected to the gate electrode (G) of a source follower FET Q3 included in the source follower transistor circuit, FET SF1. The drain electrode (D) of Q3 is also connected to the +$V_{DD}$ supply. The source electrode (S) of FET Q3 is coupled to −$V_{SS}$ through a voltage level shifting network having a plurality of serially coupled diodes D1-DM (where M is an integer selected to provide a proper quiescent operating voltage at the drain (D) of Q1) and a current source configured FET Q7. Thus, the source follower transistor network SF 1 includes the FET Q3, the voltage level shifting network (the plurality of serially coupled diodes D1-DM), and current source FET Q7, it is also noted that the voltage level shifting network (the plurality of serially coupled diodes D1 DM is connected to the FET at a node 20, such node 20 providing an output of the source follower transistor network SF 1. The output of the source follower transistor network SF 1 (that is, node 20) is coupled to the source follower transistor network SF 2. The source follower transistor network SF 2 includes a grounded drain, source follower FET Q6 and a current source configured FIT Q4.

More particularly, the node 20 is connected the gate electrode (G) of a depletion mode FET Q6, as shown. The drain electrode (D) of the FET Q6 is connected to ground and the source electrode (S) of FET Q6 is connected to −$V_{SS}$ through as current source configured FET Q4, as shown. Thus, the FET Q6 and FET Q4 provide a source follower transistor network SF 2. The source electrode (S) of FET Q6 is connected to a node 22. Also connected to node 22 are the gate of FET Q2, through a resistor R3 and RF choke L2 and the gate electrode (G) of FET Q1. Thus, output node 20 of source follower transistor network SF 1 provides a control signal to the source follower transistor network SF 2 and the source follower transistor network SF 2 supplies voltage and current to the rectifying Schottky contact gate electrode (G) of the FET Q2.

It is noted that a feedback loop FB, which is includes the control signal, is provided from the drain electrode (D) of FET Q1, to the gate electrode (G) of FET Q3 through the source electrode (S) of FET Q3, through the diodes D1-DM, to the gate electrode (G) of FET Q6 node 22 and then back to the gate electrode (G) of \FET Q1 to establish a reference current through the FET Q1 at a drain electrode (D) voltage determined by diodes D1-DM. It is noted that FET Q5 is placed into saturation so that the current between its source electrode (S) and drain electrode (D) is substantially constant with variations in the voltage across its source electrode (S) and electrode drain (D). Thus, a substantially constant current passes through FET Q5. The FET Q5 is then biased by the feedback loop FE to a current chosen by the size of FET Q5 and the source voltage determined by the number of diodes, M, of the set of number of diodes, M, of D1-DM. The voltage on Q1 gate electrode (G) is connected to node 22 which is also connected to the gate electrode (G) of the RF output FET Q2. Due to the FET Q2 being of the same semiconductor 12 as FET Q1 it will therefore be biased to the same bias point as FET Q1. The current through the M diodes D1-DM, in this example, is in the order of 5 milliamps (mA). The FET Q6 is biased to produce in this example, about 400 milliamps between its drain electrode (D) and source electrode (S). This 400 milliamp current splits between the drain electrode (D)-source electrode (S) path of FET Q4, the gate electrode (G) path to FET Q2; and the gate electrode (G) of Q1; however only a few milliamps pass to the gate electrode (G) of FET Q1. Thus, in this example, a plus or minus 200 milliamp DC bias current is available to the gate electrode (G) of FET Q2 and constant 200 milliamps passes through FET Q4. Therefore, the current supplied to the gate electrode (G) of RF output FET Q2 is used for conduction current and leakage current and such current is supplied from the smaller −8 volt (−$V_{SS}$) and ground supply rather than the larger +28 volt, (+$V_{DD}$) and −8 volt (−$V_{SS}$) supply used by source follower transistor network SF 1. To put it another way, because the magnitude of the voltage across the source follower circuit in FIG. 1 supplying current to the output FET is (|VSS|+|VDD|) whereas the magnitude of the voltage across the source follower network SF 2 feeding current to the output FET Q2 in FIG. 2 is |VSS|, which is less than |VDD|+|VSS|, power consumption is reduced.

Figure 1:
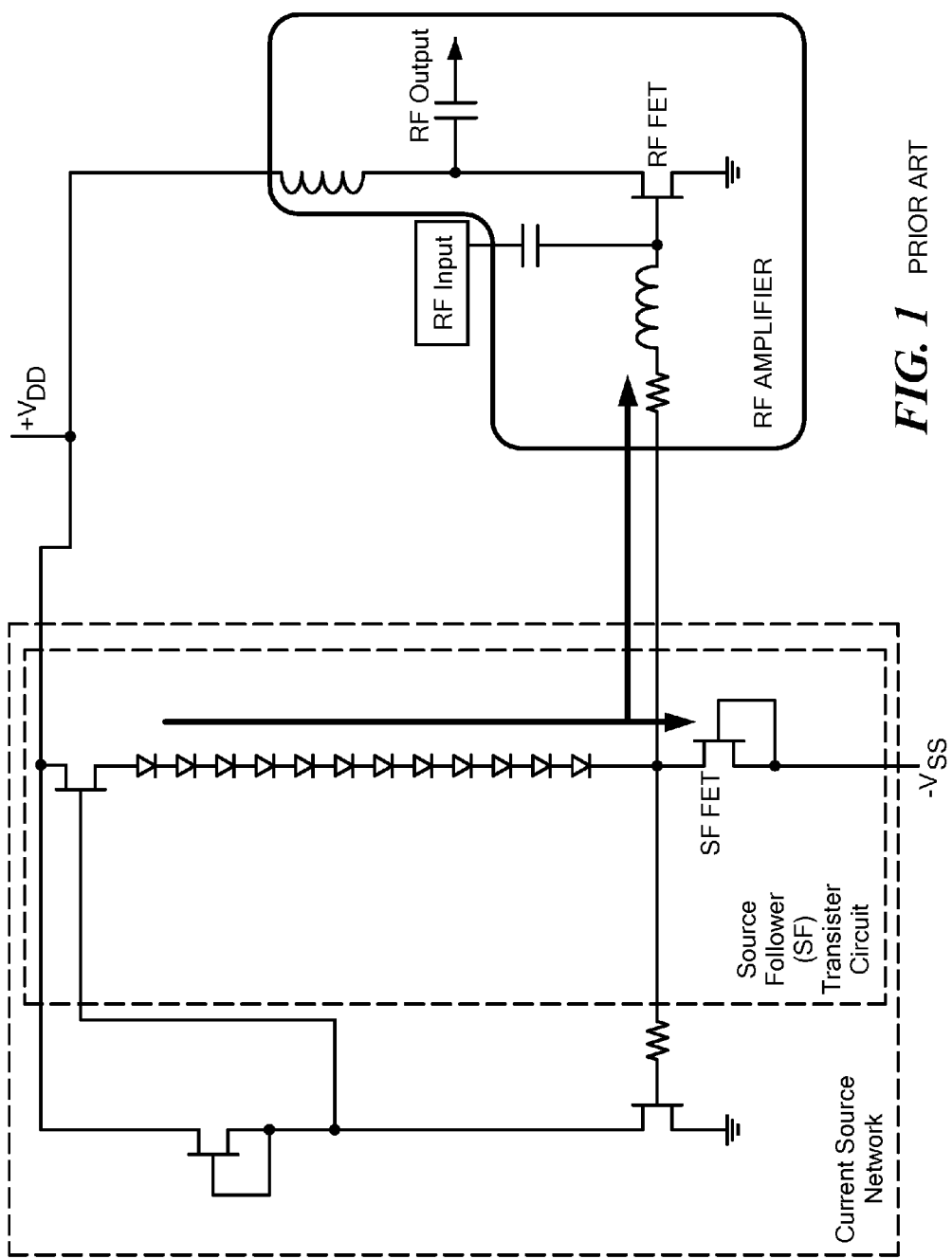
FIG. 1 is a schematic diagram of a bias circuit according to the PRIOR ART.

Therefore less power is used by the circuit 10 compared with the circuit of FIG. 1.

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A circuit, comprising:
an output transistor, the output transistor having a control electrode for controlling a flow of carriers between a first electrode and a second electrode, the second electrode is connected to ground potential; and
a bias circuit, comprising:
a pair of source follower transistors circuits;
a first one of the pair of two source follower transistor circuits being coupled between a first voltage supply having a first polarity relative to the ground potential and a second voltage supply having a second polarity relative to ground potential, the first polarity being opposite to the second polarity, the first one of the pair of the source follower transistor circuits supplying a control signal to a second one of the pair of source follower transistor circuits;
wherein the second one of the pair of source follower transistors circuits is coupled between the second voltage supply and the ground potential and wherein the second one of the pair of source follower transistor circuits produces a bias signal for the control electrode of the output transistor.
2. The circuit recited in claim 1 herein the bias circuit includes:
a current source for producing a reference current from the first voltage supply to pound potential;

a current mirror transistor coupled to the current source, the current mirror transistor having a control electrode coupled to the control electrode of the output transistor and a source electrode connected to the ground potential; and wherein the second one of the pair of source follower transistor circuits provides a feedback control voltage at a control electrode of the current mirror transistor.

3. The circuit recited in claim 2 wherein:

the output transistor is a Field Effect Transistor (FET) and the control electrode of the output transistor is a Schottky contact gate;

the first voltage supply has a positive polarity relative to ground potential; and the second voltage supply has a negative polarity relative to ground potential.

4. The circuit recited in claim 3 wherein the output transistor is a depletion mode FET.

* * * * *